(12) United States Patent
Wallace

(10) Patent No.: US 7,666,956 B2
(45) Date of Patent: Feb. 23, 2010

(54) POLYMER

(75) Inventor: Paul Wallace, Hertfordshire (GB)

(73) Assignee: Merck Patent GmbH (DE)

( * ) Notice: Subject to any disclaimer, the term of this patent is extended or adjusted under 35 U.S.C. 154(b) by 695 days.

(21) Appl. No.: 10/558,578

(22) PCT Filed: May 28, 2004

(86) PCT No.: PCT/EP2004/005818

§ 371 (c)(1),
(2), (4) Date: Feb. 1, 2006

(87) PCT Pub. No.: WO2004/106409

PCT Pub. Date: Dec. 9, 2004

(65) Prior Publication Data

US 2006/0241202 A1    Oct. 26, 2006

(30) Foreign Application Priority Data

May 30, 2003    (EP)    ................... 03012409

(51) Int. Cl.
*C08F 283/00* (2006.01)
*C08G 73/02* (2006.01)
*H01L 51/05* (2006.01)
*H01L 51/30* (2006.01)
*H01L 51/50* (2006.01)

(52) U.S. Cl. .......................... 525/540; 523/1
(58) Field of Classification Search ................ 525/540; 523/1
See application file for complete search history.

(56) References Cited

U.S. PATENT DOCUMENTS

| | | | |
|---|---|---|---|
| 4,539,507 A | 9/1985 | VanSlyke et al. | |
| 4,565,860 A | 1/1986 | Murofushi et al. | |
| 5,621,131 A | 4/1997 | Kreuder et al. | |
| 5,723,873 A | 3/1998 | Yang | |
| 5,728,801 A | 3/1998 | Wu et al. | |
| 5,798,170 A | 8/1998 | Zhang et al. | |
| 5,968,675 A | 10/1999 | Tamano et al. | |
| 6,074,734 A | 6/2000 | Kawamura et al. | |
| 6,268,695 B1 | 7/2001 | Affinito | |
| 6,956,095 B2 | 10/2005 | Treacher et al. | |
| 2001/0026878 A1 | 10/2001 | Woo et al. | |
| 2003/0018218 A1 | 1/2003 | Hosokawa et al. | |
| 2004/0260090 A1 | 12/2004 | Treacher et al. | |

FOREIGN PATENT DOCUMENTS

| | | |
|---|---|---|
| EP | 0 707 020 | 4/1996 |
| EP | 0 842 208 | 5/1998 |
| EP | 0 851 714 | 7/1998 |
| EP | 0 880 303 | 11/1998 |
| EP | 0 901 176 | 3/1999 |
| EP | 0 947 123 | 10/1999 |
| EP | 0 949 850 | 10/1999 |
| EP | 1 298 738 | 4/2003 |
| EP | 1 310 539 | 5/2003 |
| GB | 2 348 316 | 9/2000 |
| JP | 9-151371 | 6/1997 |
| JP | 11-251068 | 9/1999 |
| WO | WO-90/13148 | 11/1990 |
| WO | WO-96/22273 | 7/1996 |
| WO | WO-97/33193 | 9/1997 |
| WO | WO-98/10621 | 3/1998 |
| WO | WO-99/48160 | 9/1999 |
| WO | WO-00/48258 | 8/2000 |
| WO | WO-00/53656 | 9/2000 |
| WO | WO-00/55927 | 9/2000 |
| WO | WO-01/19142 | 3/2001 |
| WO | WO-01/66618 | 9/2001 |
| WO | WO-01/81649 | 11/2001 |
| WO | WO-02/26859 | 4/2002 |
| WO | WO-03/000773 | 1/2003 |
| WO | WO-03/048225 | 6/2003 |

*Primary Examiner*—Duc Truong
(74) *Attorney, Agent, or Firm*—Connolly Bove Lodge & Hutz LLP

(57) ABSTRACT

The present invention relates to new semiconductive polymers, a process for their manufacture and their use in thin film electronic and optical devices, such as organic light emitting diodes (OLED) and photovoltaic devices, e.g. solar cells and photo detectors.

20 Claims, No Drawings

POLYMER

RELATED APPLICATIONS

This application is a national stage application (under 35 U.S.C. 371) of PCT/EP2004/005818 filed May 28, 2004 which claims benefit to European application 0312409.3 filed May 30, 2003.

FIELD OF THE INVENTION

This invention relates to semiconductive polymers, their synthesis and use in thin film electronic and optical devices.

BACKGROUND OF THE INVENTION

Semiconducting organic materials are attracting a great deal of interest due to their processability and the broad spectrum of optical and electronic properties that may be selected according to the structure of the organic material.

One application of such materials is in switching devices, in particular as organic field effect transistors as described in, for example, Adv. Mater. 1998, 10(5), 365-377. Another application is in opto-electrical devices using a semiconducting organic material for light emission (an organic light emitting device or "OLED") or as the active component of a photocell or photodetector (a "photovoltaic" device). The basic structure of these devices is a semiconducting organic layer sandwiched between a cathode for injecting or accepting negative charge carriers (electrons) and an anode for injecting or accepting positive charge carriers (holes) into the organic layer. In an organic electroluminescent device, electrons and holes are injected into a layer of electroluminescent semiconducting material where they combine to generate excitons that undergo radiative decay. Holes are injected from the anode into the highest occupied molecular orbital (HOMO) of the electroluminescent material; electrons are injected from the cathode into the lowest unoccupied molecular orbital (LUMO) of the electroluminescent material. In WO 90/13148 the organic light-emissive material is a polymer, namely poly(p-phenylenevinylene) ("PPV"). Other light emitting polymers known in the art include polyfluorenes and polyphenylenes. In U.S. Pat. No. 4,539,507 the organic light-emissive material is of the class known as small molecule materials, such as (8-hydroxyquinoline) aluminium ("Alq$_3$"). Light emitting polymers such as polyfluorenes and polyphenylenes are advantageous in that they are solution processable. In particular, solution processable light emitting polymers may be inkjet printed as described in EP 0880303 to produce high information content displays, in particular full colour displays.

An essential requirement for an effective OLED is efficient injection of holes and electrons into the electroluminescent layer of the OLED. Therefore, a focus in the OLED field is the development of hole and/or electron transporting materials to be used in combination with the electroluminescent material. An effective hole transporting material has a HOMO level that lies between the workfunction of the anode and the HOMO level of the electroluminescent material. Furthermore, emission in a typical OLED is usually provided predominantly by the material having the smallest HOMO-LUMO bandgap and so the charge transport material should have a larger HOMO-LUMO bandgap than the electroluminescent material if emission from the charge transport material is undesirable.

Another focus in the OLED field is the development of full colour OLEDs, i.e. OLEDs comprising red, green and blue electroluminescent materials. A drawback of many blue organic electroluminescent materials is that their emission is a relatively pale blue, due to an insufficiently large HOMO-LUMO bandgap, when compared to the standard blue as defined by 1931 CIE co-ordinates.

WO 99/48160 discloses hole transporting co-polymers "TFB" and "PFB":

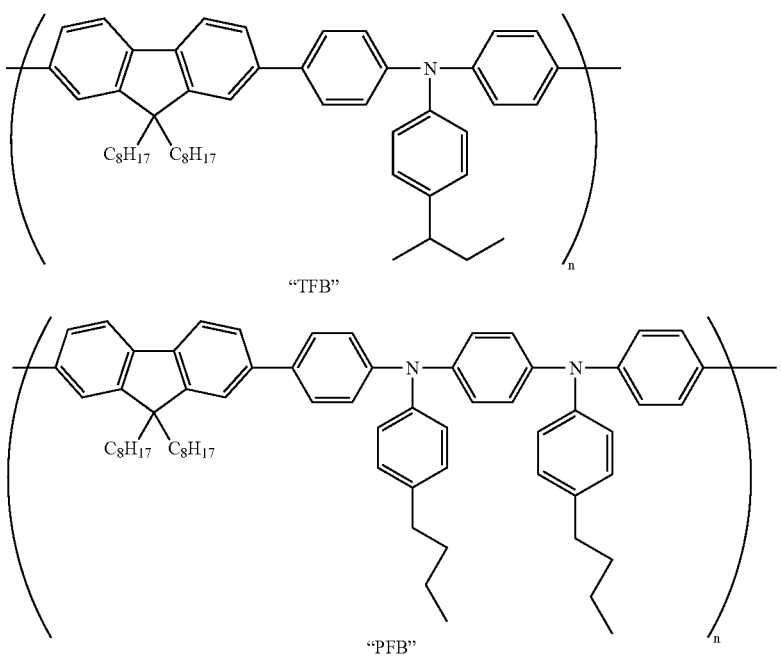

However, the above identified co-polymers have drawbacks. In particular, the HOMO levels of these materials are not ideally matched to the workfunction of ITO which negatively affects their hole transporting properties.

WO 03/000773 discloses a copolymer of "TFB-PFB" wherein dioctyifluorene units of the above co-polymers are absent.

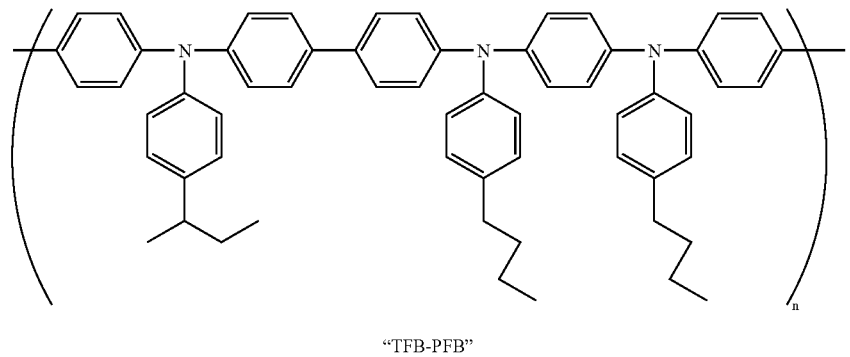

"TFB-PFB"

Polymers of this type wherein a repeat unit such as fluorene is absent can suffer from insolubility, particularly at higher molecular weights. Repeat units such as fluorene could be incorporated Into a polymer containing TFB and PFB units however this breaks up the regularity of directly linked TFB and PFB units.

JP 09-151371 discloses tri- or tetra-amine hole injecting materials of formula (A)

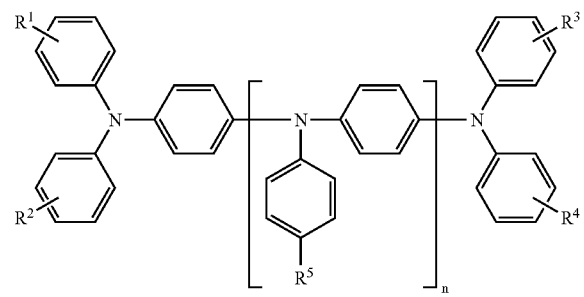

wherein $R^{1-5}$ is selected from H, methyl, methoxy, phenyl, trifluoromethyl, hydroxy, hydroxymethyl, formyl, $NH_2$, a double bonded group and an epoxy ring; and n is 1 or 2. When used in a device, this material is provided as a hole injecting layer with a separate emissive layer of $Alq_3$.

Similar compounds are disclosed in WO 96/22273 and JP 11-251068. These materials are deposited by evaporation.

Materials of this type are incorporated into a polymer in WO 97/33193 which discloses polyarylpolyamines such as an acrylate polymer of formula (B):

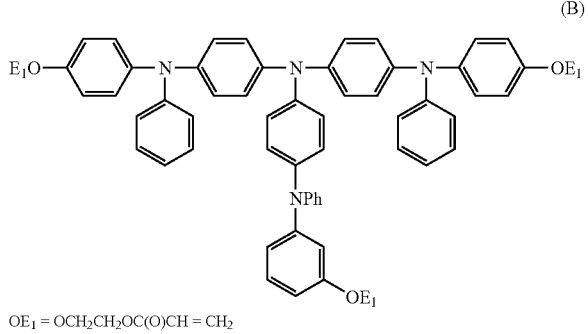

$OE_1 = OCH_2CH_2OC(O)CH=CH_2$

This material is cured to form a hole transporting layer, however the polymer derived from this material is not soluble due to cross-linking of the acrylate groups and as a result the polymer may only be formed by depositing a layer of the above monomer and curing it. Furthermore, use of acrylate groups for polymerisation does not provide any control over regioregularity of the resultant polymer.

It is therefore an object of the invention to provide a solution processable polymer having improved hole transporting properties without adversely affecting the colour of emission of the polymer by narrowing of the HOMO-LUMO bandgap.

SUMMARY OF THE INVENTION

The present inventors have surprisingly found that increasing the number of nitrogen atoms in the backbone of the repeat unit of a semiconducting polymer improves its hole transporting capability by moving the HOMO level of the resultant polymer closer to vacuum, and therefore closer to the workfunction of the anode (e.g. ITO) of the organic optoelectrical device in which said semiconducting polymer is used. The present inventors have also surprisingly found that a corresponding change in LUMO level is observed in such polymers, thus preserving the HOMO-LUMO bandgap of the polymer, or at least minimising bandgap narrowing. Furthermore, appropriate selection of the polymerisable group of the monomer of such a repeat unit enables the monomer to be polymerised by techniques such as Yamamoto or Suzuki polymerisation which afford greater control over regioregularity of polymers as compared to prior art polymers. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

Accordingly, in a first aspect the invention provides a monomer of formula (Im):

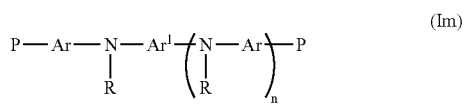

(Im)

wherein each Ar is the same or different and independently represents an optionally substituted aryl or heteroaryl; $Ar^1$ represents an optionally substituted aryl or heteroaryl; each R is the same or different and independently represents a substitutent; each P is the same or different and independently represents a leaving group capable of participating in metal insertion with a nickel or palladium complex catalyst; and n is at least 2.

In the case where n=2, R is preferably not a naphthyl group. More preferably, R in this case is not an optionally substituted condensed aromatic or heteroaromatic ring system comprising between 9 and 40 carbon atoms.

In the case where n=2, R is preferably not a phenyl group substituted in its 2 or 6 position.

Preferably, R does not comprise amino groups.

Preferably, each P is the same or different and is independently selected from halogen; a reactive boronic group selected from a boronic acid group, a boronic ester group and a borane group; a group of formula —B-$Hal_3^-M^+$ or DZ-B-$Hal_3$ wherein each Hal independently represents a halogen, M represents a metal cation and DZ represents diazonium; a group of formula wherein each Hal independently represents a halogen and M represents a metal cation a group of formula O—$SiR^7_3$ wherein each $R^7$ independently represents an optionally substituted alkyl or aryl; or a moiety of formula —O—$SO_2$-Z wherein Z is selected from the group consisting of optionally substituted alkyl and aryl.

Preferably, each P is the same or different and is independently selected from halogen; a reactive boronic group selected from a boronic acid group, a boronic ester group and a borane group; or a moiety of formula —O—$SO_2$-Z wherein Z is selected from the group consisting of optionally substituted alkyl and aryl.

Preferred halogens for P are chlorine, bromine and iodine, more preferably bromine. Preferably, Hal is fluorine. Preferably, $M^+$ is an alkali metal more preferably sodium or potassium. Preferably, $R^7$ is alkyl more preferably methyl.

Aryl or heteroaryl groups Ar and $Ar^1$ according to the Invention include monocyclic ring systems; 5- or 6-membered heteroaromatics comprising one or more of N, O and S atoms; fused aromatic ring systems such as naphthalene, fluorene and benzothiadiazole; and aryl groups comprising two or more aromatic rings that are not fused together. Aryl groups, more particularly phenyl and biphenyl, are preferred. Preferably, each Ar is optionally substituted phenyl. Preferably, each $Ar^1$ is optionally substituted phenyl or biphenyl.

Preferably, n is 2 or 3.

Preferably, each R is an optionally substituted aryl or heteroaryl, more preferably a group of formula (II):

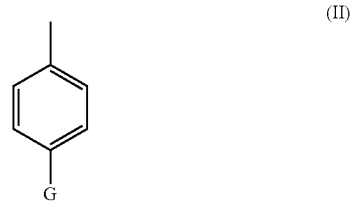

(II)

wherein G is hydrogen or a substitutent.

Preferably, G is a substituent selected from $C_{1-20}$alkyl; $C_{1-20}$alkoxy; $C_{1-20}$fluoroalkyl; $C_{1-20}$perfluoroalkyl; and fluorine.

In a second aspect, the invention provides a process for preparing a polymer comprising the step of polymerising the monomer of formula (Im).

In one preferred embodiment of the second aspect, each P is independently a halogen (preferably bromine) or a moiety of formula —O—$SO_2$-Z and the monomer of formula (Im) is polymerised in the presence of a nickel complex catalyst. The monomer (Im) according to this embodiment may be polymerised alone or may be polymerised with a second monomer.

In a second embodiment of the second aspect each P is independently a halogen or a moiety of formula —O—$SO_2$-Z; the monomer of formula (Im) is polymerised with a second monomer having at least two reactive boron functional groups independently selected from a boronic acid group, a boronic ester group and a borane group; and the polymerisation is performed in the presence of a palladium complex catalyst and a base.

In a third embodiment of the second aspect each P is independently a reactive boron functional group selected from a boronic acid group, a boronic ester group and a borane group; the monomer of formula (Im) is polymerised with a second monomer having at least two substitutents independently selected from halogen or a moiety of formula —O—$SO_2$-Z; and the polymerisation is performed in the presence of a palladium complex catalyst and a base.

In a fourth embodiment of the second aspect one P is a halogen or a moiety of formula —O—$SO_2$-Z and the other P is a reactive boron functional group selected from a boronic acid group, a boronic ester group and a borane group and the polymerisaton is performed in the presence of a palladium complex catalyst and a base. The monomer according to this fourth embodiment may be polymerised alone or with a co-monomer comprising one or more halogen groups or moieties of formula —O—$SO_2$-Z and/or one or more boron derivative functional groups.

In a third aspect, the invention provides a co-polymer comprising a first repeat unit of formula (Ir) and a second repeat unit $Ar^2$:

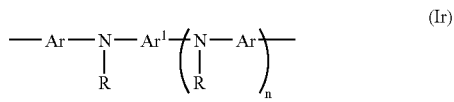
(Ir)

wherein each Ar and $Ar^1$ independently represents an optionally substituted aryl or heteroaryl; each R independently represents a substitutent; n is at least 2; and $Ar^2$ represents an optionally substituted aryl or heteroaryl that has a backbone consisting of aryl or heteroaryl groups and that is directly linked and conjugated to Ar of the first repeat unit of formula (Ir).

Preferably, $Ar^2$ is selected from the group consisting of optionally substituted phenyl, fluorene, spirobifluorene, indenofluorene and heteroaryl.

In a fourth aspect, the invention provides an optical device comprising a first electrode for injection of charge carriers of a first type, a second electrode for injection of charge carriers of a second type and a polymer obtainable by the second aspect of the invention located between the first and second electrodes.

In one preferred embodiment of the fourth aspect, the optical device comprises a hole transporting layer comprising a polymer obtainable by the second aspect of the invention.

In another preferred embodiment of the fourth aspect, the optical device comprises an electroluminescent layer comprising a polymer obtainable by the second aspect of the invention.

In a fifth aspect, the invention provides a method of forming an optical device comprising:

depositing from solution a polymer according to the third aspect of the invention onto a substrate carrying a first electrode for injection of charge carriers of a first type, and depositing over the polymer a second electrode for injection of charge carriers of a second type.

In a preferred embodiment of the fourth and fifth aspects of the invention, the first electrode is an anode and the second electrode is a cathode.

In addition to their applicability in optical devices such as OLEDs or photovoltaic devices, the polymers according to the Invention may be used in a switching device. Accordingly, in a sixth aspect the invention provides a switching device comprising a polymer according to the third aspect to the invention. In a preferred embodiment, this aspect of the invention provides a field effect transistor comprising, in sequence, a gate electrode; an insulator; a polymer according to the third aspect of the invention; and a drain electrode and a source electrode on the polymer.

In a seventh aspect, the invention provides an integrated circuit comprising a field effect transistor according to the sixth aspect of the invention.

DETAILED DESCRIPTION OF THE INVENTION

Monomers according to the invention may be used to prepare solution processable, hole transporting and/or blue emitting polymers for use in polymer light emitting devices.

Preferred methods for polymerisation of these monomers are Suzuki polymerisation as described in, for example, WO 00/53656 and WO 03/048225 and Yamamoto polymerisation as described in, for example, T. Yamamoto, "Electrically Conducting And Thermally Stable π-Conjugated Poly(arylene)s Prepared by Organometallic Processes", Progress in Polymer Science 1993, 17, 1153-1205. For example, in the synthesis of a linear polymer by Yamamoto polymerisation, a monomer having two reactive halide groups P is used. Similarly, according to the method of Suzuki polymerisation, at least one reactive group P is a boron derivative group. In the case of Suzuki polymerisations, numerous combinations of reactive groups P for the two monomers used will be apparent to the skilled person. These include: boronic acids or esters with halides, alkylsulfonates or trialkylsiloxy groups;

boronic acids or esters with diazonium tetrafluoroborates (Tetrahedron Letters, 1997, Vol 38, No 25, pp 4393-4396);

diazonium tetrafluoroborates with metal trifluoroborates (Tetrahedron Letters, 1997, Vol 38, No 25, pp 4393-4396); and metal trifluoroborates with aryl halides using ligand free palldium (e.g. palladium acetate) (Organic Letters, 2002, Vol 4, No 11, pp 1867-1870).

Suzuki polymerisation employs a Pd(0) complex or a Pd(II) salt. Pd(0) complexes are preferred, in particular Pd(0) complexes bearing at least one phospine ligand such as $Pd(Ph_3P)_4$. Suzuki polymerisation is performed in the presence of a base, for example sodium carbonate, or an organic base such as tetraethylammonium carbonate.

Yamamoto polymerisation employs a Ni(0) complex, for example bis(1,5-cyclooctadienyl) nickel(0).

Suzuki polymerisation may be used to prepare regioregular, block and random copolymers. In particular, homopolymers or random copolymers may be prepared when one reactive group P is a halogen and the other reactive group P is a boron derivative group. Alternatively, block or regioregular, in particular AB, copolymers may be prepared when both reactive groups of a first monomer are boron derivatives and both reactive groups of a second monomer are halide.

The monomer according to the invention may be polymerised alone to form a homopolymer or in the presence of one or more co-monomers to form a co-polymer. Possible co-repeat units derived from such co-monomers are outlined below; it will be appreciated that each of these co-repeat units may be derived from a comonomer comprising two polymerisable groups independently selected from halogen (preferably chlorine, bromine or iodine, more preferably bromine), a boronic acid group, a boronic ester group and a borane group.

As alternatives to halogens as described above, leaving groups such as tosylate, mesylate and triflate may also be used.

Where the monomer is co-polymerised, one class of co-repeat units in the end polymer is arylene repeat units, in particular: 1,4-phenylene repeat units as disclosed in J. Appl. Phys. 1996, 79, 934; fluorene repeat units as disclosed in EP 0842208, indenofluorene repeat units as disclosed in, for example, Macromolecules 2000, 33(6), 2016-2020 and spirobifluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer such as bulky groups, e.g. tert-butyl.

A further class of preferred co-repeat units are repeat units comprising one or two amino groups in the repeat unit backbone, in particular repeat units of formulae 1-6:

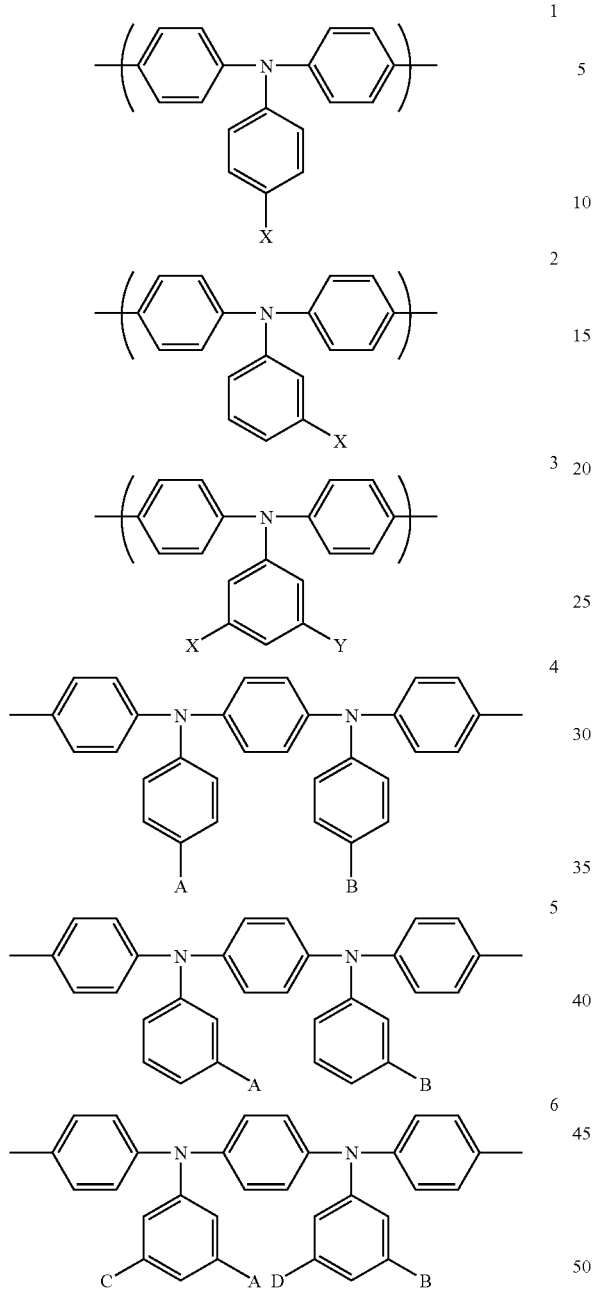

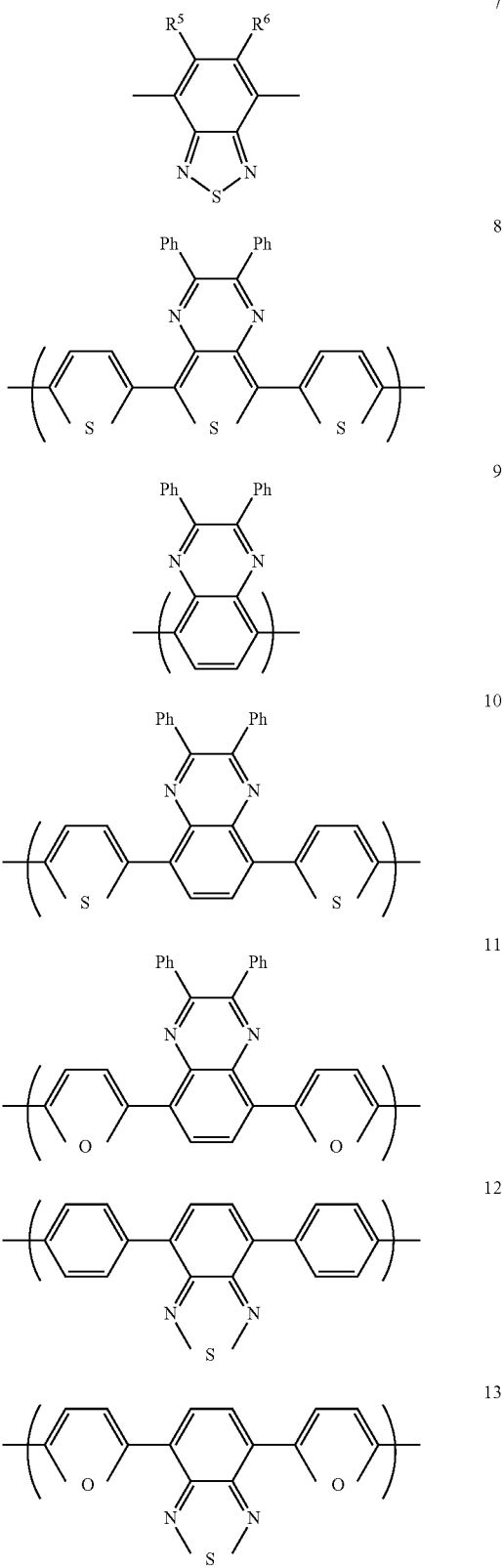

pyridyl, diazine, triazine, azble, diazole, triazole, oxazole or oxadiazole; or optionally substituted units of formulae 7-19:

X and Y may be the same or different and are substituent groups. A, B, C and D may be the same or different and are substituent groups. It is preferred that one or more of X, Y, A, B, C and D is independently selected from the group consisting of alkyl, aryl, perfluoroalkyl, thioalkyl, cyano, alkoxy, heteroaryl, alkylaryl and arylalkyl groups. One or more of X, Y, A, B, C and D also may be hydrogen. It is preferred that one or more of X, Y, A, B, C and D is independently an isobutyl group, an n-alkyl, an n-alkoxy or a trifluoromethyl group because they are suitable for helping to select the HOMO level and/or for improving solubility of the polymer.

Use of trifluoromethyl groups in repeat units of this type is disclosed in WO 01/66618.

A yet further class of co-repeat units include heteroaryl repeat units such as optionally substituted 2,5-thienyl,

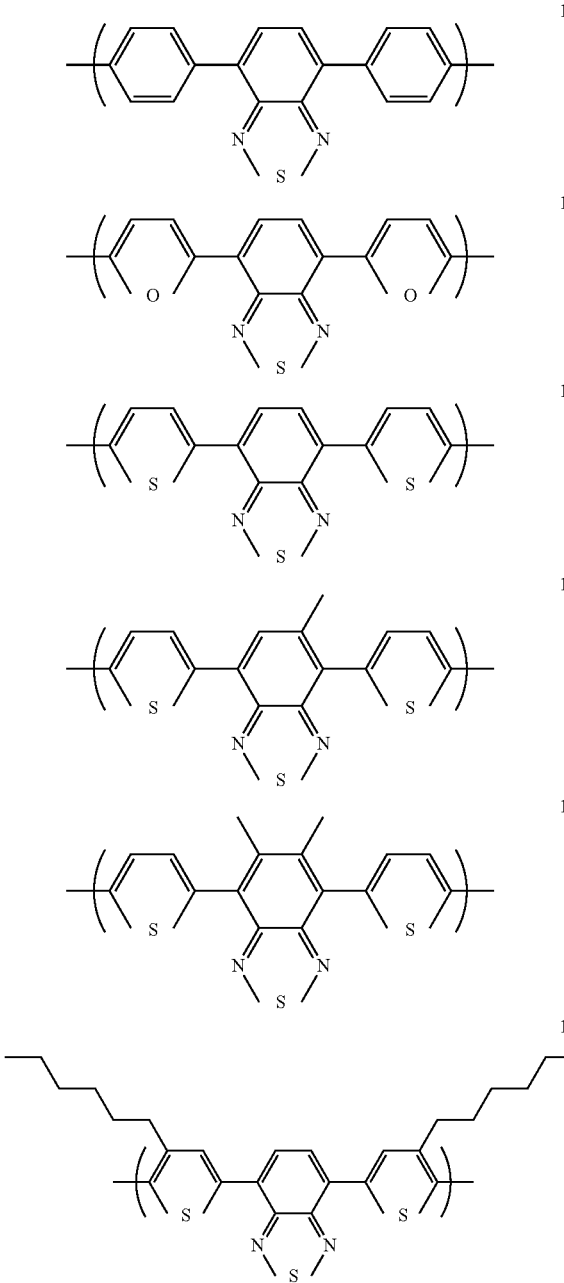

wherein $R^5$ and $R^6$ are the same or different and are each independently a substituent group. Preferably, one or more of $R^5$ or $R^6$ may be selected from hydrogen, alkyl, aryl, perfluoroalkyl, thioalkyl, cyano, alkoxy, heteroaryl, alkylaryl, or arylalkyl. These groups are preferred for the same reasons as discussed in relation to X, Y, A, B. C and D above. Preferably, for practical reasons, $R^5$ and $R^6$ are the same.

When used in an OLED, polymers prepared from monomers of the invention possess at least one of hole transporting and emissive properties. Furthermore, appropriate selection of co-repeat units may allow these polymers to possess electron transporting properties. Where the polymer has more than one of these properties, different properties may be provided by different segments of a block co-polymer, in particular segments of the polymer backbone as described in WO 00/55927 or pendant groups as described in WO 02/26859. Alternatively, if the polymer of the invention has only one or two of the properties of hole transport, electron transport and emission, it may be blended with one or more further polymers having the remaining required property or properties as described in WO 99/48160.

Polymers made in accordance with the invention may be used as active materials in any of the aforementioned optical devices, in particular electroluminescent devices and photovoltaic devices (i.e. photodetectors or photocells). Such optical devices comprise a substrate carrying the polymer located between a positive charge carrying electrode and a negative charge carrying electrode. In forming these devices, the polymer may be deposited from solution by any one of a range of techniques including in particular techniques such as spin-coating, dip-coating, inkjet printing as disclosed in EP 0880303, laser transfer as described in EP 0851714, flexographic printing, screen printing and doctor blade coating.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

Although not essential, the presence of a layer of organic hole injection material over the anode is desirable as it assists hole injection from the anode into the layer or layers of semiconducting polymer. Examples of organic hole injection materials include PEDT/PSS as disclosed in EP 0901176 and EP 0947123, or polyaniline as disclosed in U.S. Pat. No. 5,723,873 and U.S. Pat. No. 5,798,170.

The cathode is selected in order that electrons are efficiently injected into the device and as such may comprise a single conductive material such as a layer of aluminium. Alternatively, it may comprise a plurality of metals, for example a bilayer of calcium and aluminium as disclosed in WO 98/10621, or a thin layer of dielectric material such as lithium fluoride to assist electron injection as disclosed in, for example, WO 00/48258.

The device is preferably encapsulated with an encapsulant to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142.

In a practical optoelectronic device, at least one of the electrodes is semi-transparent in order that light may be absorbed (in the case of a photoresponsive device) or emitted (in the case of a PLED). Where the anode is transparent, it typically comprises indium tin oxide. Examples of transparent cathodes are disclosed in, for example, GB 2348316. Where the polymer of the invention is used in a switching device such as a field effect transistor, it will be appreciated that all of the electrodes may be opaque.

The PLED may be a passive matrix or active matrix device.

EXAMPLES

1) Monomer Example (I)

A monomer of formula (I) was formed according to either one of the two methods set out below:

Method 1:
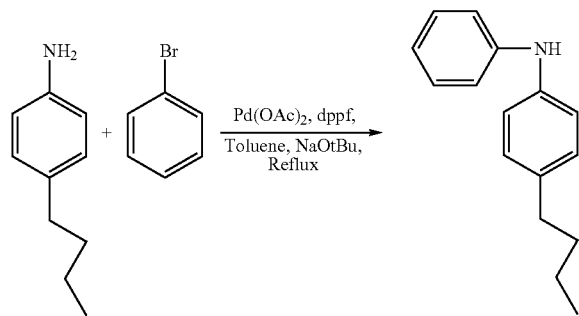
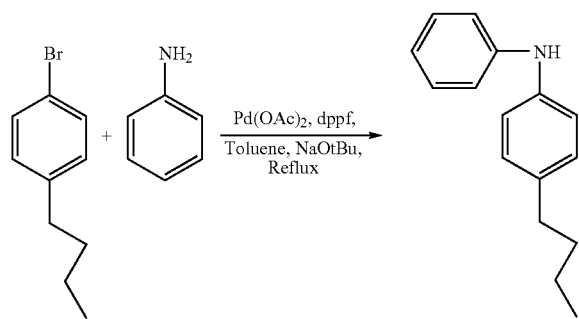
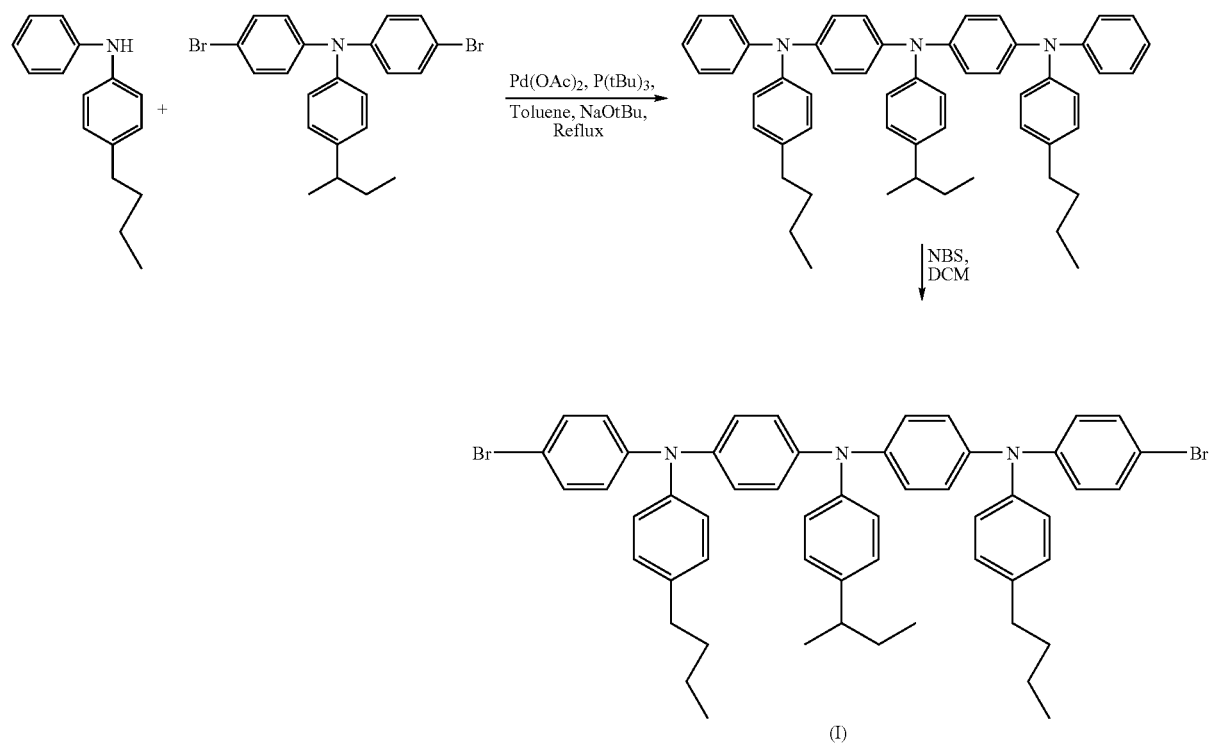

Method 2:
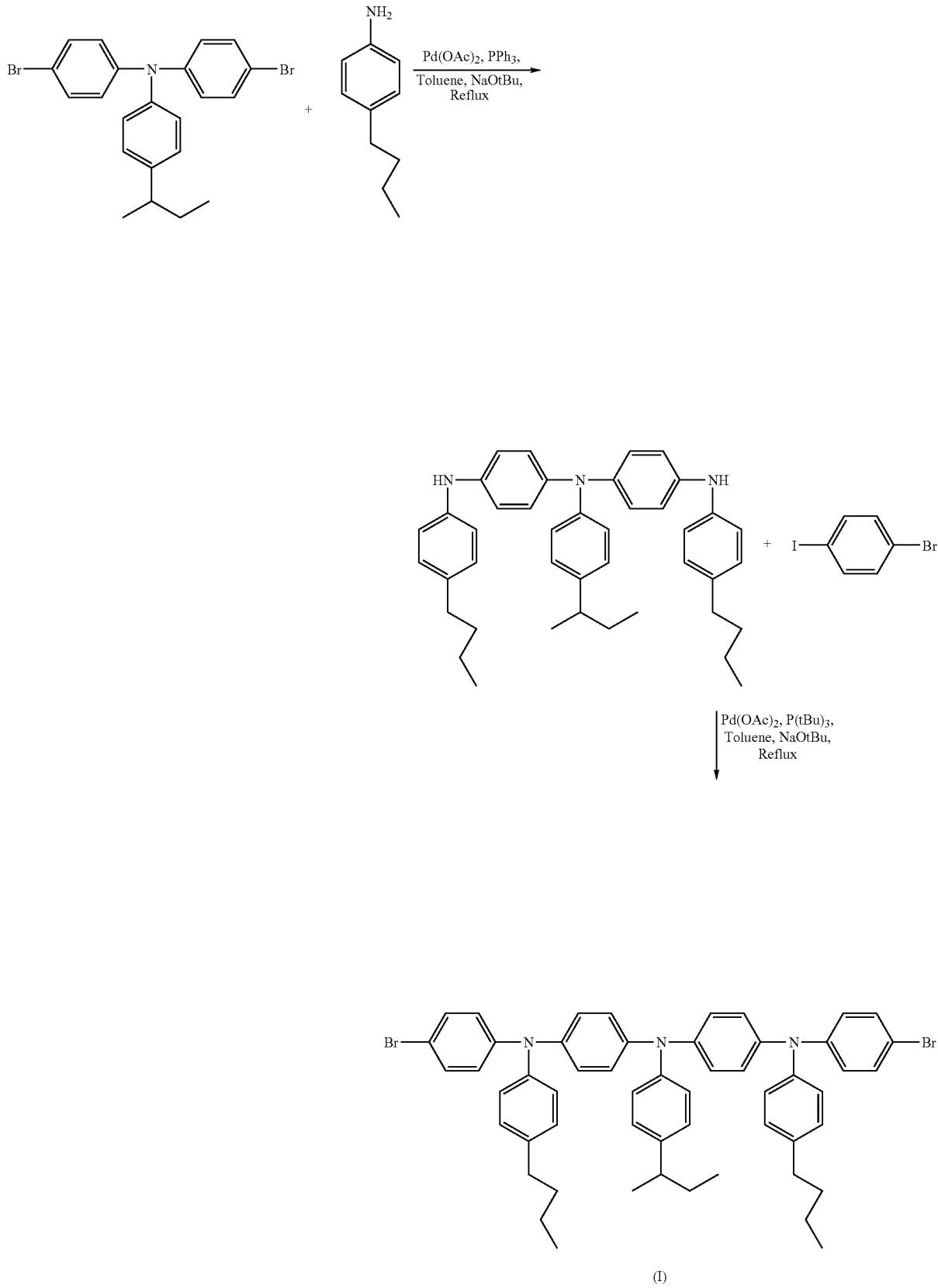

2) Monomer Example (II)
A monomer of formula (II) was formed according to the method set out below:
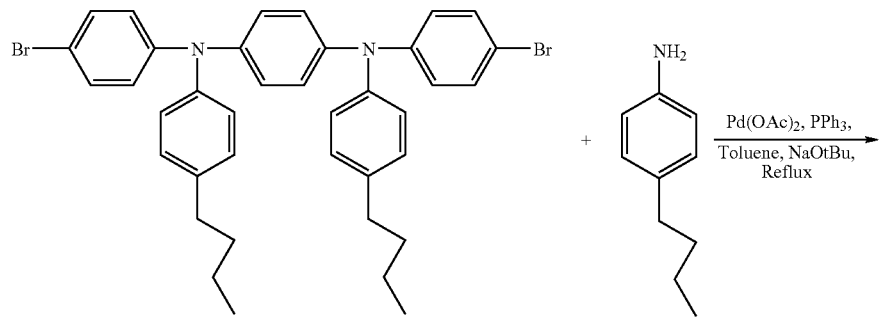
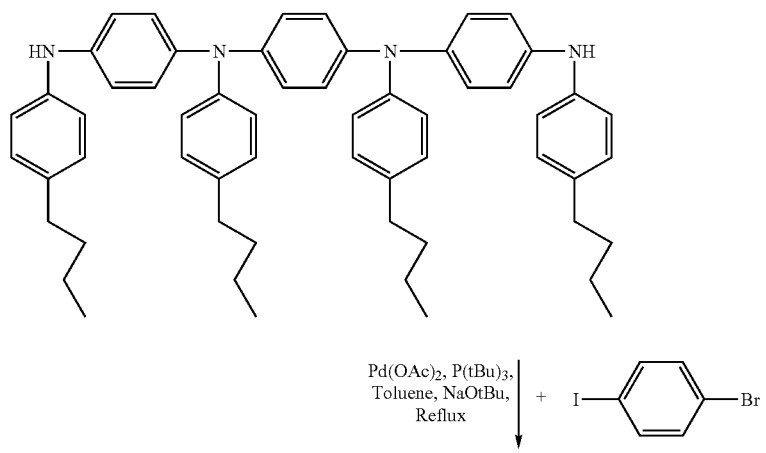
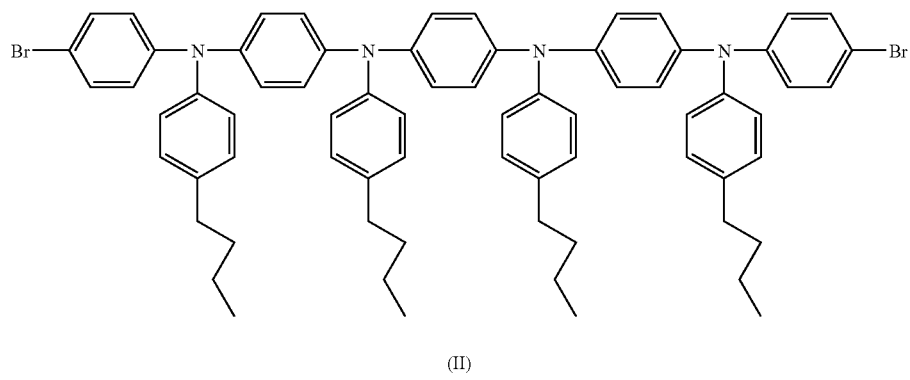
(II)

3) Monomer Example (III)
A monomer of formula (III) was formed according to the method set out below:
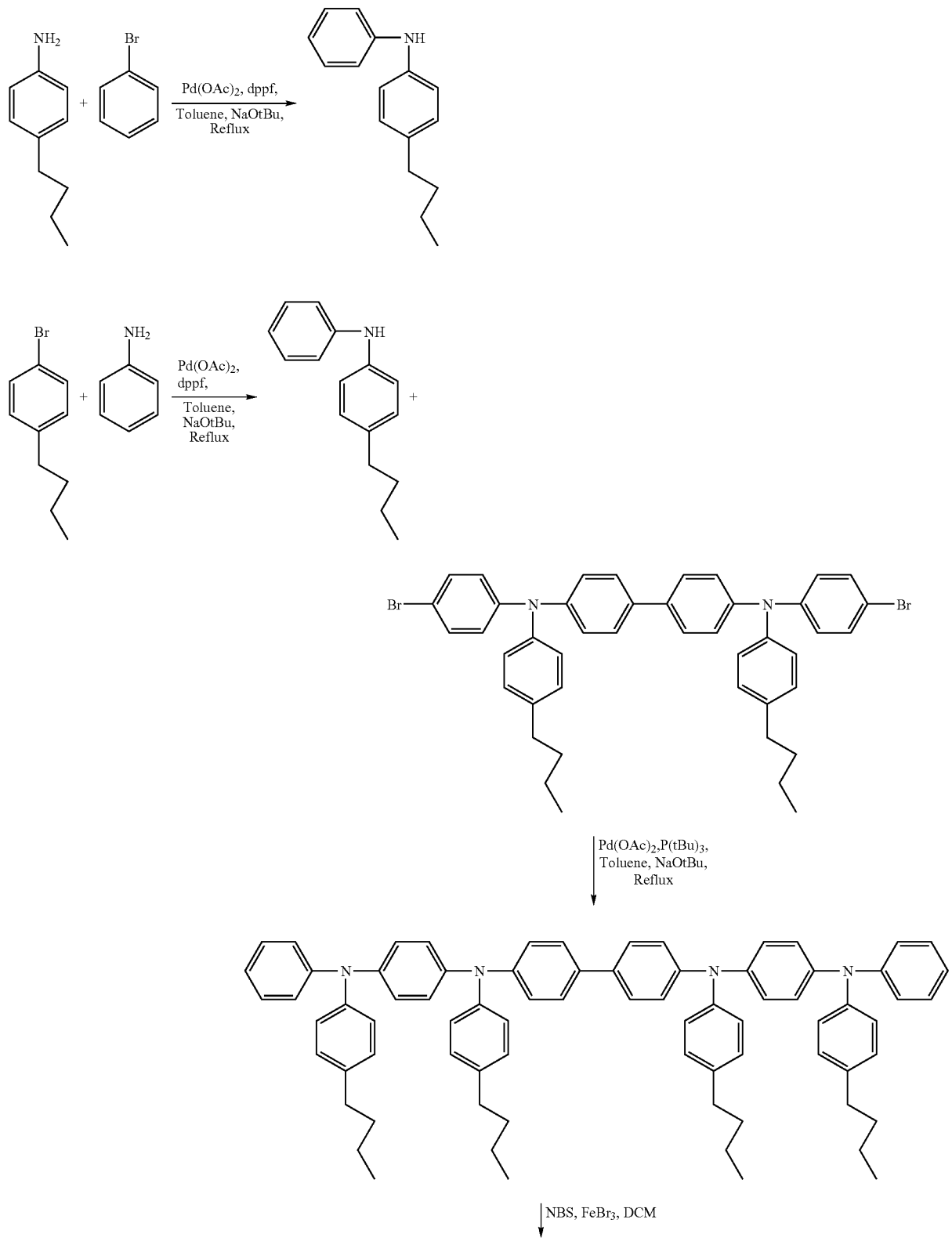

-continued

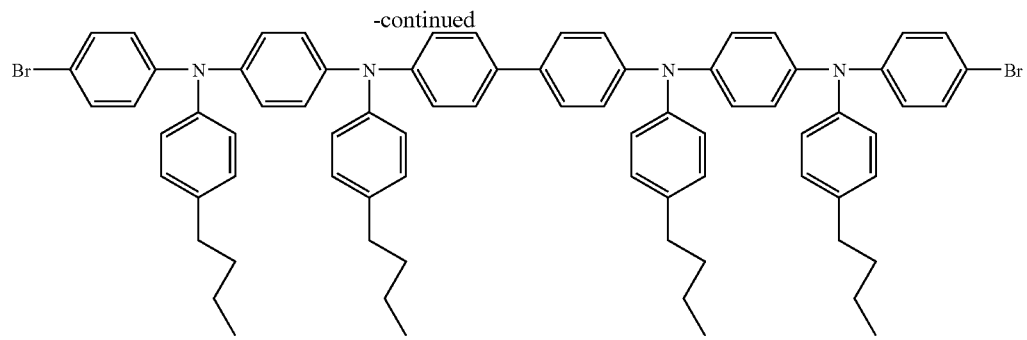

(III)

The central biphenyl ring of monomer (III) may be provided with substituents such as alkyl or alkoxy as disclosed in Macromol. Symp. 1997, 125, 157-164. These substituents induce twisting of the phenyl rings relative to each other, thus disrupt conjugation along the backbone of the repeat unit.

4) Polymer Examples

Monomer examples (I) and (III) were co-polymerised with (a) 2,8-diboronic acid-6,6,12,12-tetra(n-octyl)indenofluorene pinacol diester (shown below as "alkyl-indenofluorene"), (b) a dialkyl-diphenyl indenofluorene boronic acid ester (shown below as alkyl-aryl indenofluorene and (c) a spirobifluorene boronic acid diester (shown below as "spirofluorene"), by Suzuki polymerisation according to the method set forth in WO 00/53656. For the purpose of comparison, polymers comprising the prior art repeat unit "PFB", described above, were also formed.

TABLE 1

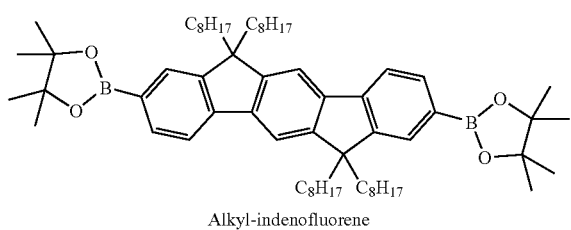
Alkyl-indenofluorene

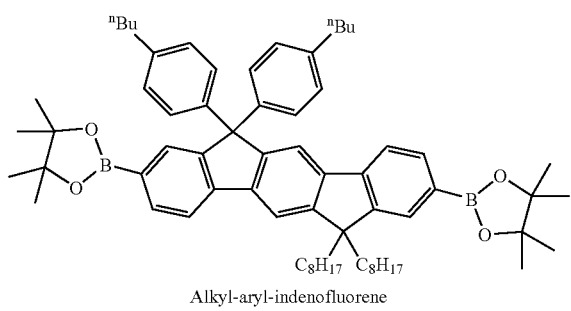
Alkyl-aryl-indenofluorene

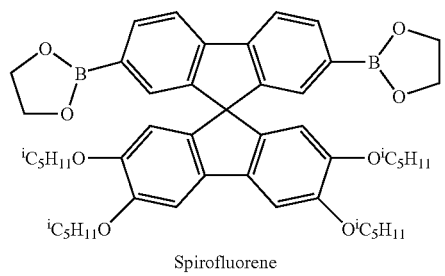
Spirofluorene

| Polymer | Monomer | Co-monomer | HOMO (eV) | Eg (eV) |
|---|---|---|---|---|
| 1 | (I) (85%) | Alkyl-aryl indenofluorene (15%) | 5.32 | 3.00 |
| 2 | PFB (85%) | Alkyl-aryl indenofluorene (15%) | 4.922 | 2.559 |

As can be seen from the results above, polymer 1 has a HOMO level closer to vacuum and a wider electrical bandgap than comparative polymer 2.

5) Device Examples

Electroluminescent devices according to the invention were formed by spin-coating onto an glass substrate comprising an indium-fin oxide anode a hole transporting layer of polyethylene dioxythiophene/polystyrene sulfonate (available from H C Starck of Leverkusen, Germany as Baytron P) and spin-coating an electroluminescent layer of a polymer according to the invention (as described in the polymer examples above) from a xylene solution, followed by formation of a cathode comprising a first layer of barium and a second layer of aluminium by vacuum evaporation. The device was sealed in anlairtight container available from Saes Getters SpA. For the purpose of comparison, devices were also formed using polymers comprising the prior art repeat unit "PFB" described above.

TABLE 2

| Device | Monomer | Co-monomer | Voltage at 100 cd/m$^2$ (V) | Maximum external quantum efficiency (%) |
|---|---|---|---|---|
| 1 | (I) (15%) | Spirofluorene (85%) | 5.2 | 2.2 |
| 2 | (III) (15%) | Spirofluorene (85%) | 4.4 | 2.8 |
| 3 | PFB (15%) | Spirofluorene (85%) | 5.9 | 1.5 |

As can be seen from the above results, the devices according to the invention provide significantly lower drive voltage and higher maximum external quantum efficiency than the comparative device 3 comprising a prior art polymer.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. A monomer of formula (lm):

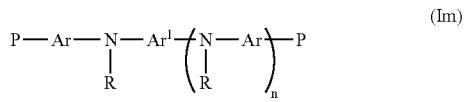

wherein each Ar is the same or different and independently represents an optionally substituted phenyl or biphenyl; $Ar^1$ represents an optionally substituted phenyl or biphenyl; each P is the same or different and independently represents a leaving group capable of participating in metal insertion with a nickel or palladium complex catalyst; n is at least 2; and each R is a group of formula (II):

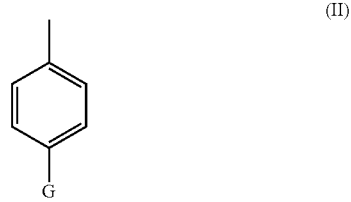

wherein G is hydrogen or a substituent selected from $C_{1-20}$ alkyl; $C_{1-20}$ alkoxy; $C_{1-20}$ fluoroalkyl; $C_{1-20}$ perfluoroalkyl; and fluorine.

2. A monomer according to claim 1 wherein each P is the same or different and is independently selected from halogen; a reactive boronic group selected from a boronic acid group, a boronic ester group and a borane group; a group of formula $—B-Hal_3{}^-M^+$ or $DZ—B-Hal_3$ wherein each Hal independently represents a halogen, M represents a metal cation and DZ represents diazonium; a group of formula wherein each Hal independently represents a halogen and M represents a metal cation a group of formula $O—SIR^7{}_3$ wherein each $R^7$ independently represents an optionally substituted alkyl or aryl; or a moiety of formula $—O—SO_2$-Z wherein Z is selected from the group consisting of optionally substituted alkyl and aryl.

3. A monomer according to claim 1 wherein n is 2 or 3.

4. A process for preparing a polymer comprising the step of polymerizing the monomer of formula (lm')

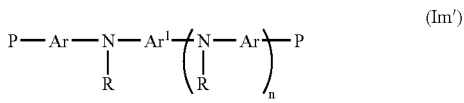

wherein each Ar is the same or different and independently represents an optionally substituted aryl or heteroaryl; $Ar^1$ represents an optionally substituted aryl or heteroaryl; each R is the same or different and independently represents a substitutent; each P is the same or different and independently represents a leaving group capable of participating in metal insertion with a nickel or palladium complex catalyst; and n is at least 2.

5. A process according to claim 4 wherein each P is independently a halogen or a moiety of formula $—O—SO_2$-Z and the monomer of formula (lm) is polymerized in the presence of a nickel complex catalyst.

6. A process according to claim 4 wherein each P is independently a halogen or a moiety of formula $—O—SO_2$-Z, the monomer of formula (lm) is polymerized with a second monomer having at least two reactive boron functional groups independently selected from a boronic acid group, a boronic ester group and a borane group, and the polymerization is performed in the presence of a palladium complex catalyst and a base.

7. A process according to claim 4 wherein each P is independently a reactive boron functional group selected from a boronic acid group, a boronic ester group and a borane group; the monomer of formula (lm) is polymerized with a second monomer having at least two substitutents independently selected from halogen or a moiety of formula $—O—SO_2$-Z; and the polymerization is performed in the presence of a palladium complex catalyst and a base.

8. A process according to claim 4 wherein one P is a halogen or a moiety of formula $—O—SO_2$-Z and the other P is a reactive boron functional group selected from a boronic acid group, a boronic ester group and a borane group, and the polymerization is performed in the presence of a palladium complex catalyst and a base.

9. A process according to claim 4 wherein the monomer of formula (lm) is polymerized with a second monomer selected from the group consisting of optionally substituted aryl and heteroaryl groups.

10. A process according to claim 9 wherein the second monomer is selected from the group consisting of optionally substituted phenyl, fluorene, spirobifluorene, indenofluorene and heteroaryl.

11. A co-polymer comprising a first repeat unit of formula (lr) and a second repeat unit $Ar^2$:

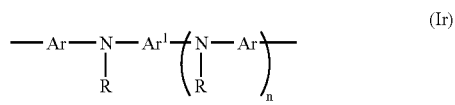

wherein each Ar is the same or different and independently represents an optionally substituted aryl or heteroaryl; $Ar^1$ represents an optionally substituted aryl or heteroaryl; each R is the same or different and independently represents a substitutent; n is at least 2; and Ar represents an optionally substituted aryl or heteroaryl that has a backbone consisting of aryl or heteroaryl groups and that is directly linked and conjugated to Ar of the first repeat unit of formula (lr).

12. A co-polymer according to claim 11 wherein $Ar^2$ is selected from the group consisting of optionally substituted phenyl, fluorene, spirobifluorene, indenofluorene and heteroaryl.

13. An optical device comprising a first electrode for injection of charge carriers of a first type, a second electrode for injection of charge carriers of a second type and a polymer according to claim 11 located between the first and second electrodes.

14. A method of forming an optical device comprising
depositing from solution a polymer according to claim 11 onto a substrate carrying a first electrode for injection of charge carriers of a first type, and
depositing over the polymer a second electrode for injection of charge carriers of a second type.

15. A switching device comprising a polymer according to claim 11.

16. A field effect transistor comprising, in sequence, a gate electrode; an insulator; a polymer according to claim 11; and a drain electrode and a source electrode on the polymer.

17. An integrated circuit comprising a field effect transistor according to claim 16.

18. The co-polymer according to claim 12, wherein $Ar^2$ is spirobifluorene.

19. The co-polymer according to claim 12, wherein $Ar^2$ is indenofluorene.

20. The co-polymer according to claim 12, wherein $Ar^2$ is phenyl or heteroraryl.

* * * * *